United States Patent [19]

Morrison et al.

[11] Patent Number: 4,502,085
[45] Date of Patent: Feb. 26, 1985

[54] POWER AMPLIFIER WITH CONTROLLABLE LOSSLESS SNUBBER CIRCUIT

[75] Inventors: Heber J. Morrison, Ellicott City; Lawrence W. Koenig, Linthicum, both of Md.

[73] Assignee: Westinghouse Electric Corp., Pittsburgh, Pa.

[21] Appl. No.: 436,866

[22] Filed: Oct. 26, 1982

[51] Int. Cl.³ .............................................. H02H 7/20
[52] U.S. Cl. ...................................... 361/56; 361/91; 363/132
[58] Field of Search ...................... 361/56, 91; 363/17, 363/52-58, 131-133, 136, 138, 139

[56] References Cited

U.S. PATENT DOCUMENTS

| | | | |
|---|---|---|---|
| 4,093,877 | 6/1978 | Pollmeier | 363/131 X |
| 4,106,088 | 8/1978 | Bergan | 363/132 |
| 4,403,269 | 9/1983 | Carroll | 361/91 |

*Primary Examiner*—Harry E. Moose, Jr.
*Attorney, Agent, or Firm*—J. B. Hinson

[57] ABSTRACT

A snubber circuit for accepting current from the load at times when switching elements of a bridge switching amplifier are being turned off was described incorporating a capacitor and diode for directing the current back to the power supply wherein the capacitor is precharged by an inductor and capacitor and at least one diode to provide resonant charging of the capacitor. A switch is also provided for activating or deactivating the snubber circuit in response to a control signal. The snubber circuit overcomes the problem of excessive power dissipation in resistors of conventional snubber circuits.

15 Claims, 3 Drawing Figures

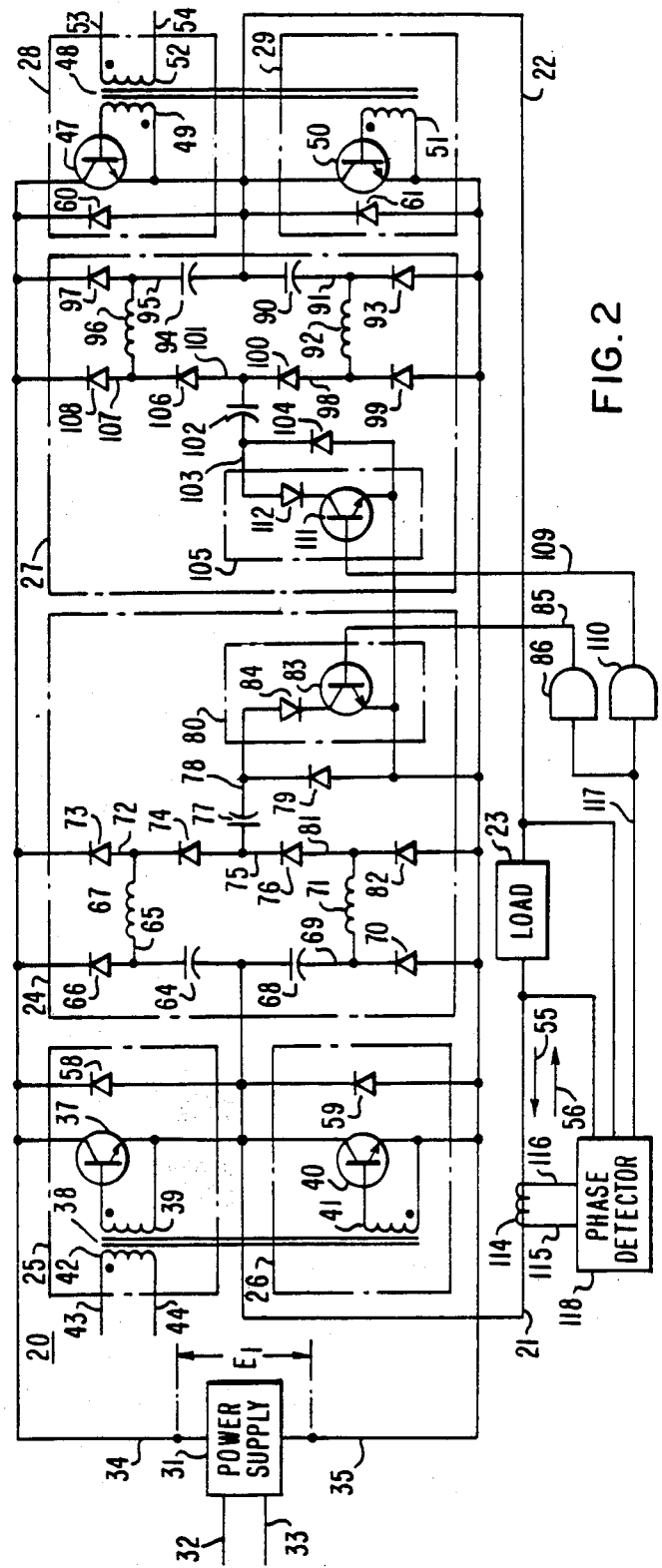

POWER AMPLIFIER WITH CONTROLLABLE LOSSLESS SNUBBER CIRCUIT

GOVERNMENT CONTRACT

The Government has rights in this invention pursuant to Contract No. F19628-79-C-0187 awarded by the Department of the Air Force.

BACKGROUND OF THE INVENTION

1. Field of the Invention

This invention relates to power amplifiers and more particularly to a snubber circuit for operation of a power amplifier with reactive loads.

2. Description of the Prior Art

In the design of transistor switching bridge amplifiers in inverter power supply circuits, the designer must protect the transistors from breakdown due to inductive turn-off when the current lags the load voltage. Load current flows through the transistor during the turn-off transition and goes to zero only after the transistor voltage has risen to the full supply voltage or higher such as due to inductor transients. Without careful design and compensation, transistors are not capable of turning off with inductive load currents. Snubber circuits that are attached to the output of a power amplifier function to absorb load current during turn-off.

One example of a prior art snubber circuit is shown in FIG. 1 which comprises a diode and capacitor in series across a switching transistor. A resistor and inductor coupled in series are placed across the diode for dissipating charge built-up across the capacitor in the course of absorbing load current. The resistor dissipates considerable power in discharging the capacitor. In addition, the snubber circuit shown in FIG. 1 imposes stress on the switching transistor at turn-on due to the addition of reset current.

In U.S. Pat. No. 3,189,796, entitled "Apparatus for Suppressing Transient During Switching" by Lynn L. Tipton which issued on June 15, 1965, the problem of a transistor switching a reactive load was addressed. The patent describes a transformer device having a magnetic core and first and second windings with the core being proportioned to saturate within the operating range of the current flowing in the windings.

In U.S. Pat. No. 3,681,659, entitled "Amplifier Protective Circuit" by Tadao Suzuki, which issued on Mar. 26, 1971, a protective circuit is described which positively and effectively limits the current flowing in the transistors for their protection. The power dissipation of the transistors to be protected and impedance of the load are sensed by the protective circuit.

It is therefore desirable to provide a power amplifier with a snubber circuit that eliminates the need for resistors to dissipate the turn-off switching energy.

It is further desirable to provide a snubber circuit that returns to the amplifier power source the amount of energy that would have been dissipated either in the switching transistors or in the resistors of a conventional snubber circuit.

It is further desirable to provide a snubber circuit which can be activated or deactivated by low level logic so that no turn-on stress is added to the amplifier transistors at times when the snubber circuit is deactivated.

SUMMARY OF THE INVENTION

In accordance with the present invention, a power amplifier incorporating a snubber circuit for supplying or absorbing current at the output terminal at times the current lags the voltage is provided comprising a capacitor and diode coupled in series between the output terminal and the positive side of the voltage supply, a second capacitor and second diode are coupled in series between the output terminal and the negative side of the power supply, the diodes being in reverse biased relationship with respect to the power supply, an inductor, diode, capacitor, and diode are coupled in series between the junction of the first capacitor and first diode and the negative terminal of the voltage supply provides a first means for charging the first capacitor, an inductor, diode, capacitor and switch coupled between the junction of the second capacitor and second diode and the negative terminal of the power supply provides a second means for charging the second capacitor.

The invention further provides a second snubber circuit to be coupled to the second output of the power amplifier which may, for example, be a four element transistor bridge switching amplifier. A switch in the snubber circuit allows the snubber circuit to be deactivated or activated at selected times such as depending on the current and voltage phase relationships across the load.

BRIEF DESCRIPTION OF THE DRAWINGS

FIG. 1 is a schematic diagram of a conventional snubber circuit; and

FIG. 2 is a schematic diagram of one embodiment of the invention.

FIG. 3 is a schematic diagram of a switch.

DESCRIPTION OF THE PREFERRED EMBODIMENTS

Referring now to the drawings, a snubber circuit 10 representative of the prior art is shown in FIG. 1. An NPN power transistor 11 having a collector, base and emitter is shown in FIG. 1 has a snubber circuit coupled across its collector and emitter. The collector of transistor 11 is coupled to the anode of diode 12 and to one side of resistor 13. The cathode of diode 12 is coupled over line 14 to one side of capacitor 15 and one side of inductor 16. The other side of resistor 13 is coupled over line 17 to the other side of inductor 16. The other side of capacitor 15 is coupled over line 18 to the emitter of transistor 11.

In operation of snubber circuit 10, transistor 11 is switched on. The voltage across the collector and emitter is low and any charge on capacitor 15 is dissipated by inductor 16 and resistor 13. When transistor 11 is turned off, the voltage across the collector and emitter will increase. However, now the load current which previously flowed in the device 11 during turnoff will now flow through forward biased diode 12 and capacitor 15. The voltage across capacitor 15 will stabilize to the voltage across transistor 11 at times transistor 11 is off. When transistor 11 again switches on, the voltage across the collector and emitter will be low and the voltage across capacitor 15 will be discharged by inductor 16 and resistor 13. Energy stored on capacitor 15 is dissipated in resistor 13 in the form of heat.

FIG. 2 shows a four element bridge switching amplifier 20 having an output on lines 21 and 22 coupled across the load 23. Snubber circuit 24 is coupled to output line 21 and functions to absorb current from load 23 at times when either switching element 25 or 26 are turned off. Snubber circuit 27 is coupled to output line 22 and functions to absorb current from load 23 at times either switching element 28 or 29 are turned off.

A power supply 31 may have power coupled in on lines 32 and 33 and power coupled out over lines 34 and 35. The voltage $E_1$ on line 34 may, for example, be a positive voltage with respect to line 35 such as 260 volts. Switching elements 25 and 26 are coupled in series between lines 34 and 35 and switching elements 28 and 29 are coupled in series between lines 34 and 35. Switching element 25 may, for example, comprise an NPN bipolar transistor 37 having its collector coupled to line 34 and its emitter coupled to line 21. Transformer 38 may have a first winding 39 coupled across the base and emitter of transistor 37. Switching element 26 may include NPN bipolar transistor 40 having its collector coupled to line 21 and its emitter coupled to line 35. Winding 41 of transistor 38 is coupled between the base and emitter of transistor 40. Winding 42 having input leads 43 and 44 energizes transformer 38 and permits a voltage and current to be coupled out of windings 39 and 41. The voltage coupled out of windings 39 and 41 are opposite in polarity so that transistor 37 is turned on at times transistor 40 is turned off and vice versa. Transformer 38 may have an iron core to facilitate magnetic coupling between windings.

Switching element 28 may include NPN bipolar transistor 47 having its collector coupled to line 34 and its emitter coupled to line 22. Transformer 48 may have a winding 49 coupled between the base and emitter of transistor 47. Switching element 29 may include NPN transistor 50 having its collector coupled to line 22 and its emitter coupled to line 35. Transformer 48 may have winding 51 coupled across the base and emitter of transistor 50. Transformer 48 may have winding 52 having input lines 53 and 54 for energizing winding 52 and causing voltage and current to flow through windings 49 and 51 to energize transistors 47 and 50. The windings 49 and 51 are coupled to transistors 47 and 50 such that when the emitter of transistor 47 is positive, the emitter of transistor 50 is negative. When winding 52 is energized in one direction, transistor 47 is turned on and transistor 50 is turned off. When winding 52 is energized in the opposite direction, transistor 50 is turned on and transistor 47 is turned off. Windings 42 and 52 may be energized simultaneously so that transistors 40 and 47 are conducting concurrently while transistors 37 and 50 are off. Transistor 47 would then couple line 34 to load 23 via line 22 and transistor 40 would couple line 21 the other side of load 23 to line 35 of power supply 31 such that current would flow through the load 23 as shown by arrow 55.

At other times, windings 42 and 52 may be energized such that transistors 37 and 50 are on and transistors 40 and 47 are off. Transistor 37 would couple line 34 of power supply 31 to line 21 of load 23. Transistor 50 would couple line 35 of power supply 31 to load 23 via line 22 causing current to flow through load 23 in the opposite direction of arrow 55 shown by arrow 56.

Switching element 25 may also include diode 58 having its anode coupled to line 21 and its cathode coupled to line 34. Switching element 26 may have a diode 59 having its anode coupled to line 35 and its cathode coupled to line 21. Switching element 28 may have diode 60 having its anode coupled to line 22 and its cathode coupled to line 34. Switching element 29 may have diode 61 having its cathode coupled to line 22 and its anode coupled to line 35. Diodes 58 and 60 function to clamp lines 21 and 22 from positive-voltage excursions above the voltage of line 34 plus the diode voltage drop. Diodes 59 and 61 function to clamp lines 21 and 22 from negative voltage excursions below the voltage of line 35 minus the diode voltage drop.

Snubber circuit 24 is coupled to output line 21 of bridge switching amplifier 20 for supplying or absorbing current from load 23 at times switching element 25 or 26 is being turned off. Line 21 is coupled through capacitor 64 over line 65 to the anode of diode 66 and inductor 67. The cathode of diode 66 is coupled to line 34. Line 21 is also coupled through capacitor 68 over line 69 to the cathode of diode 70 and to inductor 71. The anode of diode 70 is coupled to line 35. Inductor 67 is coupled over line 72 to the anode of diode 73 and the cathode of diode 74. The cathode of diode 73 is coupled to line 34. The anode of diode 74 is coupled over line 75 to the cathode of diode 76 and through capacitor 77 over line 78 to the cathode of diode 79 and to one side of switch 80 which may, for example, be a single pole single throw switch. The anode of diode 76 is coupled over line 81 to inductor 71 and the cathode of diode 82. The anode of diode 82 is coupled to line 35. The other side of switch 80 is coupled to line 35. The anode of diode 79 is coupled to line 35. Switch 80, for example, may include NPN bipolar transistor 83 having its collector coupled to the cathode of diode 84 and its emitter coupled to line 35. The anode of diode 84 is coupled to line 78. The base of transistor 83 is coupled over line 85 to the output of driver 86. Driver 86 functions to turn on or off switch 80. Switch 80 may also be a metal oxide semiconductor field effect transistor 87 having a gate, source, drain and body as shown in FIG. 3.

Line 22 of bridge switching amplifier 20 is coupled through capacitor 90 over line 91 to inductor 92 and the cathode of diode 93. The anode of diode 93 is coupled to line 35. Line 22 is also coupled through capacitor 94 over line 95 to inductor 96 and the anode of diode 97. The cathode of diode 97 is coupled to line 34. Inductor 92 is coupled over line 98 to the cathode of diode 99 and the anode of diode 100. The cathode of diode 100 is coupled over line 101 through capacitor 102 over line 103 to the cathode of diode 104 and to one side of switch 105. The cathode of diode 100 is also coupled over line 101 to the anode of diode 106. The cathode of diode 106 is coupled over line 107 to inductor 96 and the anode of diode 108. The cathode of diode 108 is coupled to line 34. The anode of diode 99 is coupled to line 35. The anode of diode 104 is coupled to line 35. The control of switch 105 is coupled over line 109 to the output of driver 110. Driver 110 functions to cause switch 105 to be on or off depending upon its logic output. Switch 105 may, for example, include NPN transistor 111 having its emitter coupled to line 35 and its collector coupled to the cathode of diode 112. The anode of diode 112 is coupled to line 103.

Snubber circuits 24 and 27 may be activated at times when the current lags the voltage by using phase detector 118. Phase detector 118 has the voltage across load 23 coupled over lines 21 and 22 and the current through load 23 detected by winding 114 coupled over lines 115 and 116. The output on line 117 of phase detector 118 may indicate the times when the current through load 23 lags the voltage across load 23. The output voltage of phase detector 118 is coupled over line 117 to the input of drivers 86 and 110 which in turn energize transistors 83 and 111 to be on or conducting. At other times, the output voltage of phase detector 118 may be low such that the output of drivers 86 and 110 may cause transistors 83 and 111 to be off or non-connecting.

In operation of snubber circuit 24 and 27, switch 80 and 105 is turned on or conducting. Line 75 of snubber circuit 24 will have been charged to one-half the voltage $E_1$ of line 34 with respect to line 35 due to the voltage swing on line 21 from the voltage of line 35 and line 34. The voltage on line 21 is coupled through capacitor 68, inductor 71, diode 76 to place a voltage across capacitor 77 with respect to line 35. Likewise, snubber circuit 27 has the voltage across capacitor 102 charged to one-half the value of the voltage $E_1$ on line 34 due to the fact that the voltage on line 22 has switched repeatedly from the voltage on line 35 to the voltage on line 34. The voltage across capacitor 102 has been charged by conduction of current through capacitor 90, inductor 92 and diode 100.

With switching elements 26 and 28 on, snubber capacitors 64 and 90 of snubber circuits 24 and 27, respectively, are "reset" in the following manner. Capacitor 64 is reset by current flowing from the potential across capacitor 77, line 75, through diode 74, inductor 67, capacitor 64, switching element 26, diode 79 and back to capacitor 77 via line 78. By means of resonant L-C charging where L is inductor 67 and C is the capacitance of capacitor 64 and 77 in series capacitor 64 becomes charged to twice the voltage on line 75 with line 65 being charged to the potential $E_1$ of line 34 with respect to line 21 at times when switching element 26 is on. After the current charging capacitor 64 completes one-half cycle and attempts to reverse, it is blocked by diodes 74 and 79. The peak reset current $I_R$ is given by equation 1 where C is a value of capacitance of capacitor 64 and 77 in series and L is the value of inductor 67.

$$I_R = E_1 \sqrt{\frac{C}{L}} \text{ Amps. Peak} \quad (1)$$

The reset time $t_R$ should be less than one-half the period of the highest operating frequency of bridge switching amplifier 20. The reset time $t_R$ is given in equation 2 where $f_R$ is the frequency of operation of the bridge switching amplifier, L is the value of inductor 67 and C is the value of the capacitance of capacitor 64 and 77 in series.

$$t_R = \frac{1}{2f_R} = \frac{2\pi\sqrt{LC}}{2} = \pi\sqrt{LC} \quad (2)$$

Equation 2 must also use the value of inductors 71, 92 and 96 with the series capacitance of capacitors 68 and 77, 90 and 102, and 94 and 102, respectively.

Capacitor 90 of snubber circuit 27 is reset by current flowing from line 34 through switching element 28, capacitor 90, inductor 92, diode 100, capacitor 102, diode 112, transistor 111 to line 35. Capacitor 90 becomes charged to voltage $E_1$ by resonant charging. Diodes 112 and 100 prevent current flow in the reverse direction.

With switching elements 26 and 28 on, load current flows from line 34 through switching element 28, load 23 and switching element 26 to line 35 to power supply 31. When switching elements 26 and 28 are turned off with load current still flowing as shown by arrow 55, the load current is now returned to line 34 of power supply 31. Current flows through load 23, through capacitor 64, diode 66 to line 34. Load current flows from power supply 31 line 35, through diode 93, capacitor 90 to load 23 via line 22. In other words, the snubber components conduct the load current back to power supply 31 while the switching elements 26 and 28 are turning off.

Operation of switching amplifier 20 and snubber circuits 24 and 27 for the second half cycle of the operating frequency is similar except that switching elements 25 and 29 are now on and switching elements 26 and 28 are off. During the operation in which the load current is either "in phase with" or leading the load voltage, the snubber action by snubber circuits 24 and 27 may not be required.

In order to cease operation of snubber circuits 24 and 27, switches 80 and 105 are turned off such as by the voltage on line 117. With switches 80 and 105 off, both sides of capacitors 77 and 102 have the same wave shape as their respective output terminals 21 and 22. Capacitor 77 has the same wave shape as line 21 and capacitor 102 has the same wave shape as line 22 with no current flowing in the reset circuits. For best operation, inductors 67, 71, 92 and 96 are of equal value or L=L1=L2=L3=L4. The value of the capacitance in equation 1 or 2 is given by equation 3.

$$C = \frac{C77 \times C64}{C77 + C64} = \frac{C77 \times C68}{C77 + C68} = \quad (3)$$

$$\frac{C102 \times C94}{C102 + C94} = \frac{C102 \times C90}{C102 + C90}$$

Capacitance C77 may be 4 or 5 times larger than C64 or C68. C64 may equal C68, C94 and C90. C102 may be 4 or 5 times larger than C94 or C90.

Diodes 73 and 108 function to clamp the maximum voltage of line 72 and 107 to the voltage of line 34 plus the diode voltage drop. Diodes 82 and 99 function to clamp the voltage on lines 81 and 98, respectively, to the voltage of line 35 minus the diode voltage drop.

A snubber circuit has been described for accepting current from a load in a bridge switching amplifier at times when the switching elements are turning off comprising capacitors which have been precharged at times when the switching element is on which will discharge in absorbing current from the load and passes current through a diode back to the power supply. A method for activating or deactivating the snubber circuit in response to a logic signal is provided so that at times when the snubber circuits are deactivated, the snubber circuit presents no additional load to the switching elements of the bridge switching amplifier.

We claim:
1. A power amplifier comprising:
a first switch coupled between a first and second terminal;
a second switch coupled between said second and a third terminal;
a third switch coupled between said first and a fourth terminal;
a fourth switch coupled between said fourth and third terminal;
said first terminal adapted for coupling to a positive potential of a power supply;

said third terminal adapted for coupling to a return path of said power supply;

said second and said fourth terminal adapted for coupling across a load;

a first diode coupled across said first switch having its cathode coupled to said first terminal;

a second diode coupled across said second switch having its cathode coupled to said second terminal;

a third diode coupled across said third switch having its cathode coupled to said first terminal;

a fourth diode coupled across said fourth switch having its cathode coupled to said fourth terminal;

first means for turning said first and fourth switches on at first times to conduct current through said load in a first direction and for turning said second and third switches on at second times to conduct current through said load in a second direction opposite said first direction;

a first capacitor having one side coupled to said second terminal and the other side coupled to the anode of a fifth diode, the cathode of said first diode coupled to said first terminal;

first means for charging said first capacitor to a predetermined voltage at times said second switch is conducting;

a second capacitor having one side coupled to said second terminal and the other side coupled to the cathode of a sixth diode, the anode of said second diode coupled to said third terminal;

second means for charging said second capacitor to a predetermined voltage at times said first switch is conducting.

2. The power amplifier of claim 1 wherein said first means includes:

a first inductor having one side coupled to the other side of said first capacitor and the other side of said first inductor coupled to the cathode of a seventh diode, the anode of said seventh diode coupled through a third capacitor to the cathode of a eighth diode, the anode of said eighth diode coupled to said third terminal and third means for charging said third capacitor.

3. The power amplifier of claim 1 wherein said second means includes:

a first inductor having one side coupled to the other side of said second capacitor and the other side of said first inductor coupled to the anode of a seventh diode, the cathode of said seventh diode coupled through a seventh capacitor through a fifth switch to said third terminal.

4. The power amplifier of claim 3 wherein said fifth switch includes a transistor.

5. The power amplifier of claim 4 wherein said transistor is bipolar.

6. The power amplifier of claim 4 wherein said transistor is a metal oxide semiconductor field effect transistor.

7. The power amplifier of claim 5 wherein said transistor is NPN and further including a ninth diode in series with the collector of said transistor.

8. The power amplifier of claim 3 further including a tenth diode coupled between the other side of said first inductor and said third terminal.

9. The power amplifier of claim 8 wherein the anode of said ninth diode is coupled to said third terminal.

10. The power amplifier of claim 2 further including a tenth diode coupled between the other side of said first inductor and said first terminal.

11. A snubber circuit for supplying current at the output terminal of a bridge amplifier adapted for coupling between a first and second terminal of a voltage supply comprising:

a first capacitor coupled to said output terminal and coupled through a first diode to said first terminal;

a second capacitor coupled to said output terminal and coupled through a second diode to said second terminal; and first means for charging said first and second capacitors.

12. The snubber circuit of claim 11 wherein said first diode has its cathode coupled to said first terminal.

13. The snubber circuit of claim 11 wherein said second diode has its anode coupled to said second terminal.

14. The snubber circuit of claim 11 wherein said first means includes second means for charging said first capacitor at times the voltage of the output terminal is decreasing to the potential of said second terminal.

15. The snubber circuit of claim 11 wherein said first means includes second means for charging said second capacitor at times the voltage of the output terminal is increasing to the potential of said first terminal.

* * * * *